United States Patent [19]

Jungkman et al.

[11] Patent Number: 4,488,414
[45] Date of Patent: Dec. 18, 1984

[54] DISC DETECTOR ASSEMBLY

[75] Inventors: David L. Jungkman, Hudson, N.H.; Roger C. Coda, Harvard; Peter N. Nicholson, Dracut, both of Mass.

[73] Assignee: Honeywell Inc., Minneapolis, Minn.

[21] Appl. No.: 538,384

[22] Filed: Oct. 3, 1983

[51] Int. Cl.³ ............................................. F25B 19/00
[52] U.S. Cl. .................................. 62/514 R; 62/264; 250/352
[58] Field of Search .............. 62/264, 514 R; 250/352

[56] References Cited

U.S. PATENT DOCUMENTS 3,979,325  9/1976  Ceccaldi et al. ................... 250/352
4,386,505  6/1983  Little ................................. 62/514 R Primary Examiner—Ronald C. Capossela
Attorney, Agent, or Firm—John S. Solakian; Laurence J. Marhoefer

[57] ABSTRACT

A miniature, nonevacuated, detector refrigerator assembly for use in infrared imaging systems is described. The assembly incorporates a miniature Joule-Thomson laminar refrigerator which serves as the substrate for the detector subassembly, electrical leads, as well as the primary structural element of the assembly. The detector subassembly is positioned on the cold region of the refrigerator, surrounded by insulating material and capped by an optical window or filter as required. As a result, the detector is cooled while the contact pads used for connection to external devices are at the ambient temperature. A piece of high thermally conductive material may be placed in the vicinity of the detector subassembly so that during operation gases in the chamber surrounding the detector assembly will preferentially condense thereon rather than on the detector subassembly.

14 Claims, 1 Drawing Figure

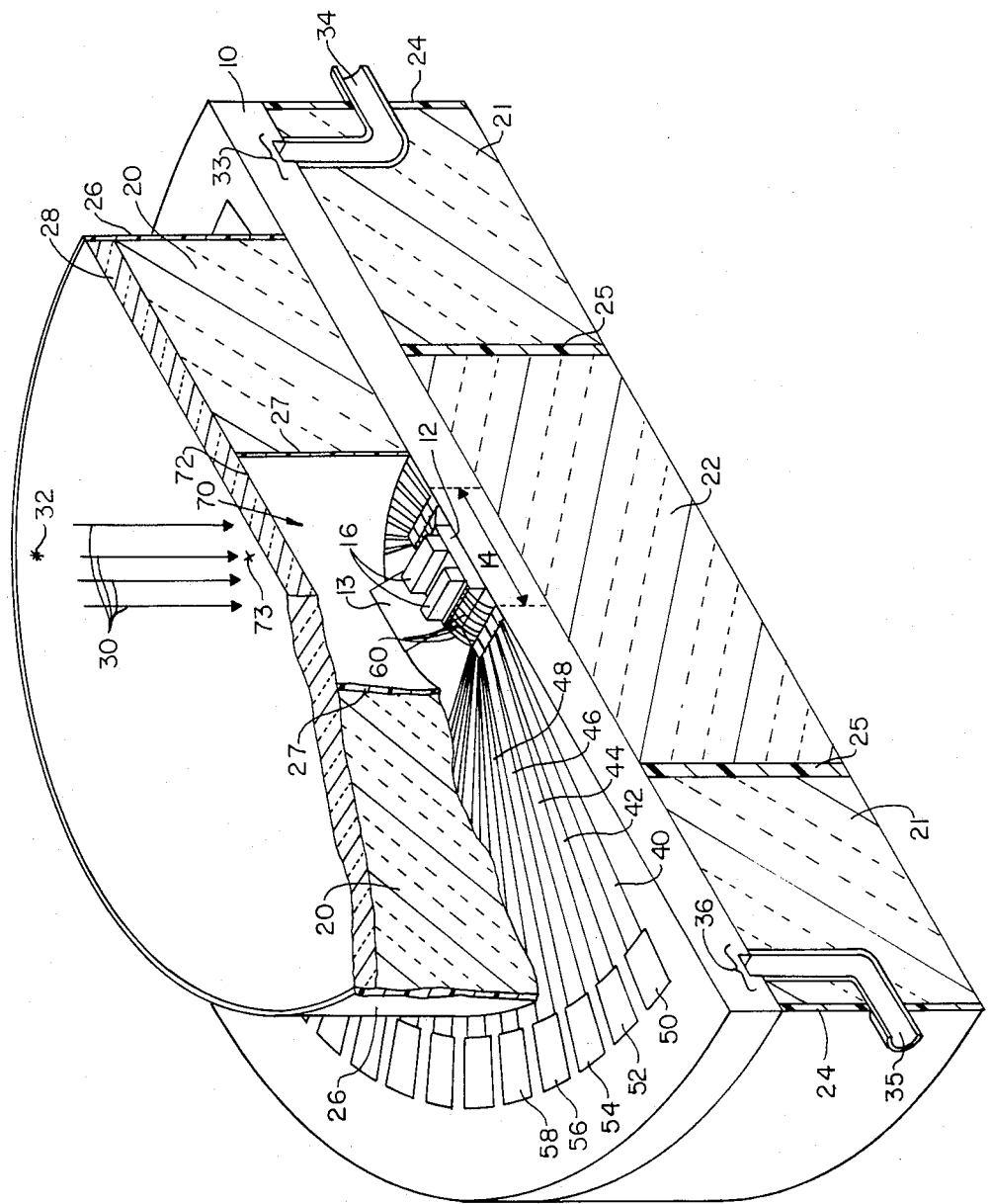

DISC DETECTOR ASSEMBLY

BACKGROUND OF THE INVENTION

The device of the present invention relates to cryogenically cooled detector assemblies, and, more particularly, to miniaturized cryogenically cooled detector assemblies used for thermal imaging systems.

In most thermal imaging systems using semiconductor detection devices, it is necessary to place the detectors in a vacuum environment for two reasons; first, to protect the detectors from condensation of gases, since the detectors operate at cryogenic temperatures, and, second, to minimize heat load to the cryogenic refrigerator by these same gases. In the past, the cryogenic cooler (or "refrigerator") design and general packaging requirements have been such that the detector dewar/refrigerator was economically nonexpendable. Because of the refrigerator size, the packaging of the system was generally large, and, therefore, the total system costs were high. Since the package design and weight was large, the cooldown time for these system was relatively long.

As a result, the use of cryogenically cooled infrared detectors was limited to applications in which cooldown time and portability are not critical, and in which the detector system was reusable, for example, in airborne infrared reconnaissance cameras, tank or periscope sights, etc. The cost, size, weight and cool-down time of such systems have for the most part barred their use in small heat-seeking munitions.

Recently, a fast cool-down, low cost "microminiature" refrigerator has become commercially available, which, if packaged properly with infrared detectors makes possible the use of detection assemblies in a variety of small, low cost applications. These applications include infrared binoculars, munitions, and other either highly portable or expendable applications. The theory and design of the refrigerator has been fully described by Robert Wolfe and Robert Duboc, Jr. "Small Wonders: Microminiature Refrigerators for Cooling Detectors", Photonics Spectra, July, 1983. A brief summary of these devices in included here as background to the apparatus of the present invention.

Like the prior art refrigerators typically used in infrared imaging systems, the new microminiature refrigerator operate on the principle of the Joule-Thomson effect. Gas at high pressure is expanded rapidly through a small orifice and therefore cools. The cooled gas is passed through a heat exchanger to precool the high pressure incoming gas, which provides lower temperature during expansion. This regenerative process continues to the liquification temperature of the gas. In prior imaging systems, a typical refrigerator was embodied in a long cylindrical "cold finger" consisting of capillary tubes and cooling fins, wherein the cooling function was directed to the end of the cylindrical cold finger. To complete the refrigerator, a close fitting closed cylinder was required to contain and direct the cold exhaust gas over the incoming high pressure gas in the heat exchanger area. This closed cylinder of precise diameter and length is incorporated into the detector dewar. The closed end is the detector support. A vacuum container surrounds the cylinder to limit heat flow and condensation.

These prior art refrigerators have several problems which make them impractical for use in small portable or expendable systems. First, the size of the refrigerator necessarily leads to a large package (dewar) size. Second, because of the large dewar size and the mass of the associated components, these devices generally require several minutes to achieve operating cryogenic temperature. Third, the cost is increased because of several factors. For example, the cost to provide the precision diameter of the closed cylinder is increased. Also, the closed cylinder is approximately two (2) inches long so that, although the detectors are small, the package must be large in order to contain the refrigerator and must be of precise size. Further, since the area of the refrigerator is large, the surrounding gas must be removed, i.e., a vacuum is required, all of which increases cost. This vacuum must be maintained over the desired life of the system so that thermal conduction through the vacuum space will not increase the refrigerator temperature. The detector sitting on the end of the coldfinger must be located accurately with respect to the optical system. To achieve this precise position many parts of the detector dewar require close tolerance manufacture and special assembly jigs. Finally, obtaining a hard vacuum requires glass-to-metal seals, welds, solder joints or brazes. All are expensive compared to a glued joint as provided by the present invention.

In the microminiature refrigerator design, the capillary tube and expansion chamber system comprising the Joule-Thomson refrigerator is embedded in a low thermally conductive substrate, such as glass. This device may take any geometric form, but generally is comprised of thin glass plates which have been etched to provide the required ports and capillary channels for the heat exchange sections, which are laminated to form a single planar element. Conventional infrared detector systems using the microminiature refrigerator have utilized packaging concepts similar to those embodied in systems having large prior art refrigerators. Specifically, in such systems the detector assembly has been mounted on the cold spot of the microminiature refrigerator, and the refrigerator has been placed inside a large vacuuable housing with an optical window located near the detector assembly. Pump-out ports, getters, and electrical vacuum feedthroughs typical of prior art systems have been included. In some cases, the electrical leads from the detector assembly have been printed directly on the refrigerator substrate.

It is, accordingly, an object of the present invention to provide an improved detector packaging assembly which is more compact, requires fewer parts, has no tolerance build-up and is less expensive to build.

It is another object of the present invention to provide a self-contained detector package which requires no vacuum housing, no getters, no pump-out port and no electrical vacuum feedthroughs.

Another object of the present invention is to provide a refrigerator and detector assembly design which is suited for use in portable systems requiring "instant on" capability, for example, in infrared binoculars, or infrared gun sights.

It is a further object of the present invention to provide a refrigerator and detector assembly design which can withstand high shock environments.

SUMMARY OF THE INVENTION

The above and other objects of the present invention are achieved by using the microminiature planar refrigerator as both the substrate for the detector assembly and as the primary structural element of the package.

The perimeter of the refrigerator remains at room temperature. Its surface has the electrical leads deposited on it from the cold spot to the perimeter which is at room temperature. Insulation, such as foam, is used to insulate the cold surfaces. The housing, optical windows, etc., that complete the package are also supported by the refrigerator, which may be disc shaped for example.

The microminiature refrigerator provides fast cooldown time, shock resistance, compact size and low cost, such that a package may be developed that can be considered expendable. This detector package may be incorporated into disposable systems. It may also be incorporated into any system requiring a small low cost detector package.

In the present invention, the detector assembly is placed directly on the cold spot of the microminiature refrigerator. The electrical lead pattern is photodeposited directly on the surface of the refrigerator. The electrical leads extend to the edges of the substrate, which are at the ambient temperature. For example, in a disc shaped refrigerator, leads would terminate at contact pads located around the disc circumference. For a refrigerator of rectangular shape, the leads would terminate at pads near one or more of the edges thereof.

The immediate area surrounding the detector assembly is isolated and insulated using an appropriate poor thermal conductor. In a device using a disc shaped refrigerator, this insulation might comprise an annular piece of foam surrounding the detector assembly, which may then be capped with an optical filter or window material. Although much of the top surface of the refrigerator is covered with insulation material, the electrical contact pads remain exposed at the perimeter.

The volume of the interior chamber, which holds the detector assembly, is made small so that condensable gases are limited. Thus, a hermetic seal is not required. Where necessary, a flap of material with high thermal conductivity, such as copper, is placed under the detector assembly such that when the device is turned on the gases which are within the chamber condense preferentially on the flap, since it will cool first, rather than on the detector. In addition, the interior chamber may be filled with an appropriate gas in order to preclude water vapor and to improve detector performance.

In high shock environments, low thermal conductance supports may be attached to the lower surfaces of the refrigerator.

BRIEF DESCRIPTION OF THE DRAWING(S)

The above and other objects of the present invention are achieved in the illustrative embodiment as described with respect to the sole FIGURE which shows an isometric cut-away view of the apparatus of the present invention.

DETAILED DESCRIPTION OF THE PREFERRED EMBODIMENT(S)

Referring to the sole FIGURE, a portion of an infrared receiver is shown, specifically, the refrigerator and detector assemblies comprising the apparatus of the present invention. This apparatus comprises a microminiature refrigerator assembly 10, detector assembly 12, insulating members 20, 21 and 22, supporting members 24, 25, 26 and 27, and optical window and/or spectral filter 28.

Detector subassembly 12 is mounted directly onto the cryogenically cooled portion 14 of refrigerator 10. Detector electrical leads 40, 42, 44, 46 and 48, and contact pads 50, 52, 54, 56 and 58, are deposited directly on the surface of refrigerator 10 using well-known photolithographic and depositional techniques. Gold jumper wires 60 may be used to connect the detector assembly 12 with the detector electrical leads 40, 42, 44, 46 and 48. If necessary, a cold shield, for example, slot shield 16, may be attached to detector assembly 12 to improve performance. In addition, a flap 13 of high thermal conductive material, such as, for example, copper, aluminum, beryllia, beryllium, silver and sapphire, may be placed near detector assembly 12 such that gases within chamber 70 will condense preferentially on flap 13, rather than on detector assembly 12 during operation of refrigerator 10. In addition, or in the alternative, the interior chamber 70 may be filled with an appropriate gas, such as, for example, xenon, in order to preclude water vapor and to improve detector performance.

The structure of refrigerator 10 is such that region 14 of the refrigerator is at cryogenic temperatures, and the outer portion of the disc circumference under and around the contact pads is at ambient temperature. To maximize the cooling of the detector assembly, which is placed on region 14, and to minimize the air space surrounding the detector assembly, an annular ring of insulating material 20 is placed directly on refrigerator 10 surrounding detector assembly 12. The insulating ring may comprise any poor thermal and poor electrically conductive material, such as poured foam insulation. Low density, closed cell foam may be used.

Structural members 26 and 27 provide dams for holding the insulation material 20 which has been poured onto the device, and also serve as structural elements supporting the optical window or filter element 28. Support members 24 and 26 may be made of any suitable structural material. Members 24, 26 and 27 may be connected to refrigerator 10 using epoxy, or some similar adhesive material. Member 27 has high thermal and electrical impedance and is bonded to members 10 and 28 so that a gas tight seal is obtained. In addition, the external surface of structural member 27 may be metalized to limit migration of moisture and/or unwanted gases into the chamber 70.

Members 25 are of poor thermal conductivity, such as fiber glass, and provide structural support for high "G" environments. Gas input port 34 extends through member 24 and insulating member 21 to connect input port 33 of refrigerator 10 with an external gas supply, not shown. Exhaust gases from refrigerator 10 exit via exhaust port 36 through tubing 35 to the exterior of the device. If necessary, tubing 35 may be extended, and positioned such that the exhaust gas from the refrigerator is directed across the surface of optical window 28 to prevent condensation on optical window 28.

Having described the invention, what is claimed as new and novel and for which it is desired to obtain Letters Patent is:

1. An infrared energy receiver for measuring infrared energy from a scene of interest, said receiver having a refrigerator dewar apparatus, such apparatus comprising:

A. a substantially planar refrigerator means comprising:
      (i) an upper surface and a lower surface,
      (ii) an input gas port and an exhaust gas port,
      (iii) means for channeling and expanding pressurized gas between said input gas port and said exhaust port such that a first region of said refrigerator means is cooled, and (iv) a second region which remains substantially at the ambient temperature of said infrared energy receiver;

B. a detector assembly having one or more detector elements mounted on said upper surface of said refrigerator means in said first region such that said detector assembly is cooled by operation of said refrigerator means;

C. an electrically conductive pattern applied to said upper surface of said refrigerator means, said pattern having contact pads attached in said second region of said refrigerator means and said pattern having electrical leads to provide electrical connection from said detector elements of said detector assembly to said contact pads;

D. insulation means positioned with respect to said refrigerator means such that said first region is thermally separated from said second region, said insulation means shaped such that energy entering said receiver from said scene of interest may be collected and measured by said detector assembly; and E. an optical window covering said first region such that energy of the desired waveband from said scene of interest may enter said chamber to be collected and measured by said detector assembly.

2. An apparatus as in claim 1 wherein said refrigerator means comprises a miniature planar disc-shapged refrigerator having said first region located substantially at the center of said disc shape, and said refrigerator means having said second region located substantially around said first region along the circumference of said disc shape, wherein said input gas port and exhaust gas port are located substantially on the circumference of said disc shape.

3. An apparatus as in claim 1 wherein said insulation means comprises a lower insulating member bonded to the lower surface of said refrigerator means and an upper member bonded to the upper surface of said refrigerator means.

4. An apparatus as in claim 3 wherein said upper insulating member comprises a chamber with a first opening positioned substantially about said detector assembly such that energy from said scene of interest may be collected and measured by said detector assembly.

5. An apparatus as in claim 4 wherein the interior surfaces of said chamber are substantially air-tight.

6. An apparatus as in claim 4 further comprising means for preferential condensation of gases within said chamber, said means for preferential condensation of gases substantially in the proximity of said detector assembly.

7. An apparatus as in claim 6 wherein said means for condensation may be made from a piece of high thermally conducting material.

8. An apparatus as in claim 4 wherein said chamber is filled with a low thermally conductive gas to preclude water vapor and to improve detector performance.

9. An apparatus as in claim 8 wherein said gas may be xenon.

10. An apparatus as in claim 9 wherein the outer surface of said chamber is surrounded by one of said structural members, the exterior surface of which is metalized in order to limit the migration of moisture or other unwanted gases into said chamber.

11. An apparatus as in claim 9 wherein said structural members comprise a material having substantially poor thermal conductance and substantially poor electrical conductance.

12. An apparatus as in claim 1 wherein said insulation means comprises a closed cell foam having poor thermal conductance and having poor electrical conductance.

13. An apparatus as in claim 1 further comprising structural members attached to the upper and/or lower surfaces of said refrigerator means to provide shock resistance and to provide a protective casing.

14. An apparatus as in claim 1 wherein said refrigerator means operates on the principle of the Joule-Thomson effect.

* * * * *